(12) United States Patent
Yaegashi et al.

(10) Patent No.: US 8,283,253 B2
(45) Date of Patent: *Oct. 9, 2012

(54) PATTERN FORMING METHOD, SEMICONDUCTOR DEVICE MANUFACTURING METHOD AND SEMICONDUCTOR DEVICE MANUFACTURING APPARATUS

(75) Inventors: Hidetami Yaegashi, Yamanashi (JP); Satoru Shimura, Yamanashi (JP); Takashi Hayakawa, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 663 days.

This patent is subject to a terminal disclaimer.

(21) Appl. No.: 12/370,868

(22) Filed: Feb. 13, 2009

(65) Prior Publication Data

US 2009/0209105 A1 Aug. 20, 2009

(30) Foreign Application Priority Data

Feb. 15, 2008 (JP) .................. 2008-034231
Aug. 29, 2008 (JP) .................. 2008-221220
Jan. 16, 2009 (JP) .................. 2009-007561

(51) Int. Cl.
*H01L 21/311* (2006.01)

(52) U.S. Cl. ........ 438/694; 438/696; 438/703; 438/736; 438/738; 430/313; 430/314

(58) Field of Classification Search ........................ None
See application file for complete search history.

(56) References Cited

U.S. PATENT DOCUMENTS

| 6,858,361 | B2 * | 2/2005 | Mui et al. ................. 430/30 |
| 7,064,078 | B2 | 6/2006 | Liu et al. |
| 2006/0001151 | A1 * | 1/2006 | Ahn et al. ................. 257/701 |
| 2006/0273456 | A1 * | 12/2006 | Sant et al. ................. 257/734 |
| 2007/0020565 | A1 * | 1/2007 | Koh et al. ................. 430/313 |
| 2007/0077524 | A1 * | 4/2007 | Koh et al. ................. 430/314 |
| 2007/0123037 | A1 * | 5/2007 | Lee et al. ................. 438/636 |
| 2007/0148968 | A1 | 6/2007 | Kwon et al. |
| 2007/0287299 | A1 * | 12/2007 | Lee et al. ................. 438/761 |
| 2008/0008969 | A1 | 1/2008 | Zhou et al. |
| 2008/0057692 | A1 * | 3/2008 | Wells et al. ................. 438/597 |
| 2008/0179715 | A1 * | 7/2008 | Coppa ................. 257/647 |

FOREIGN PATENT DOCUMENTS

| JP | 2002-319584 A | 10/2002 |
| JP | 2006-261307 A | 9/2006 |
| JP | 2008-083537 A | 4/2008 |
| JP | 2009-158913 A | 7/2009 |
| JP | 2009-543378 A | 12/2009 |

OTHER PUBLICATIONS

Chinese Office action for 2009100069519 dated Mar. 16, 2010.

* cited by examiner

*Primary Examiner* — Lan Vinh
*Assistant Examiner* — Jiong-Ping Lu
(74) *Attorney, Agent, or Firm* — Pearne & Gordon LLP

(57) ABSTRACT

A pattern forming method for forming a pattern serving as a mask, includes a process for forming a first pattern 105, a process for trimming a width of the first pattern 105, a process for forming a boundary layer 106 on a surface of the first pattern 105, a process for forming a second mask material layer 107 on a surface of the boundary layer 106, a process for removing a part of the second mask material layer 107 to expose top portions of the boundary layer 106, and a process for exposing the first pattern 105 and forming a second pattern having the second mask material layer 107 at a top portion thereof by etching the boundary layer 106.

12 Claims, 8 Drawing Sheets

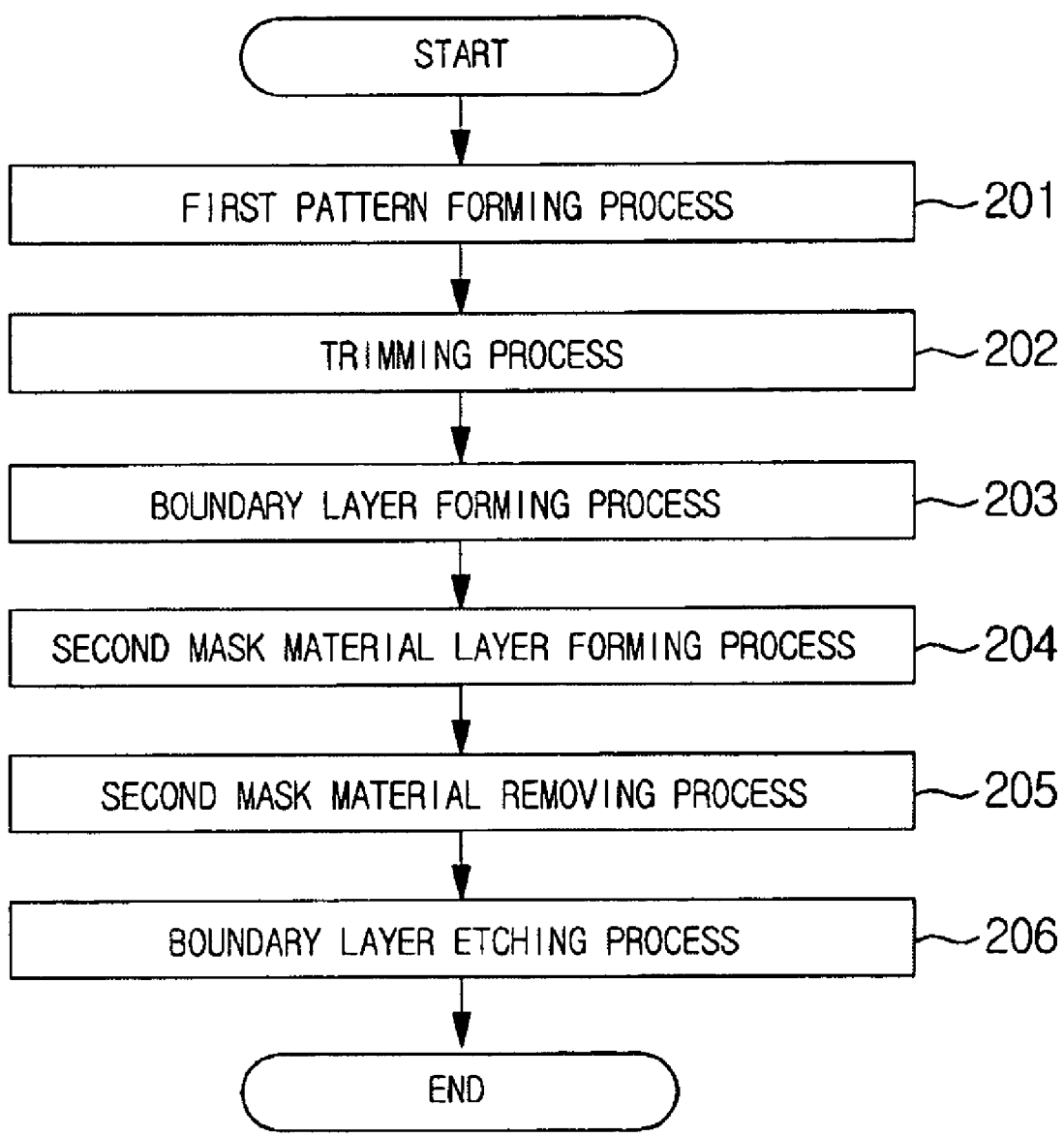

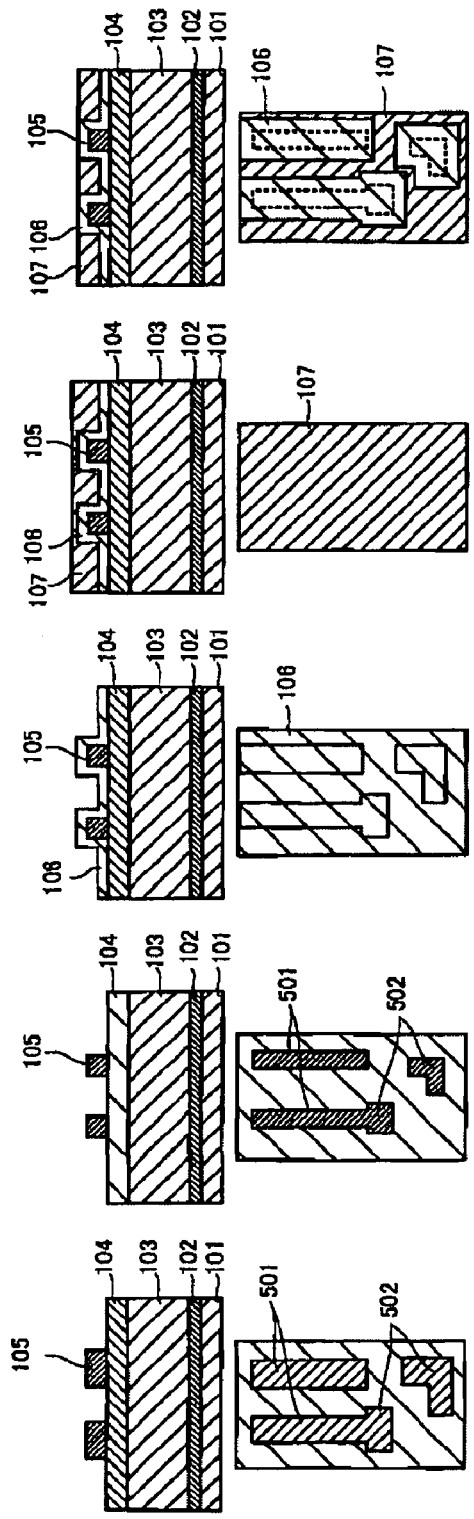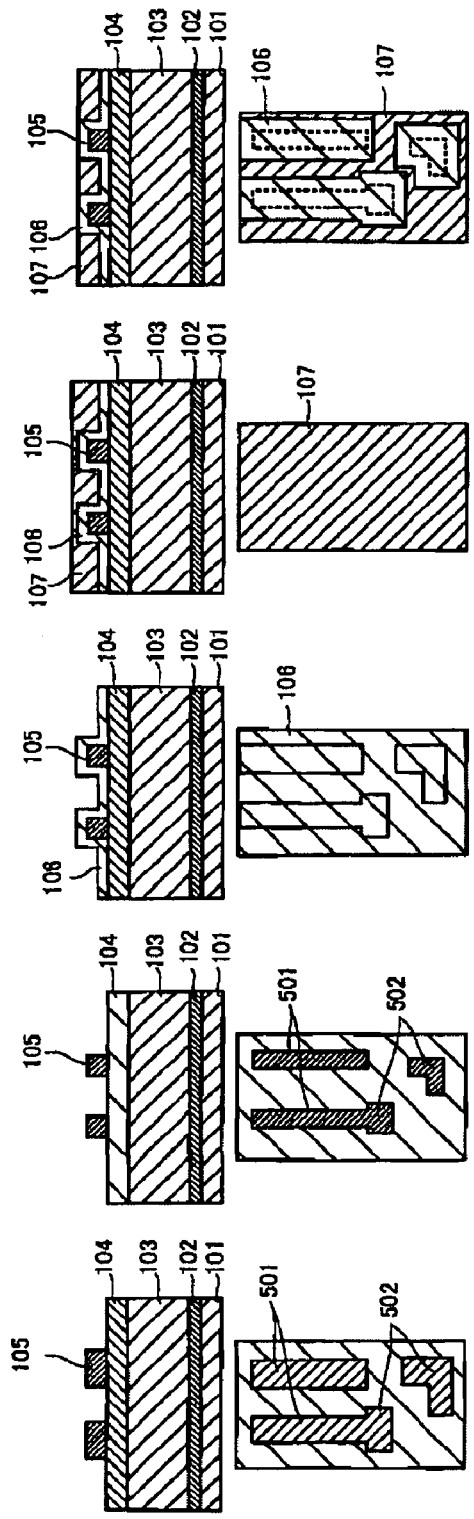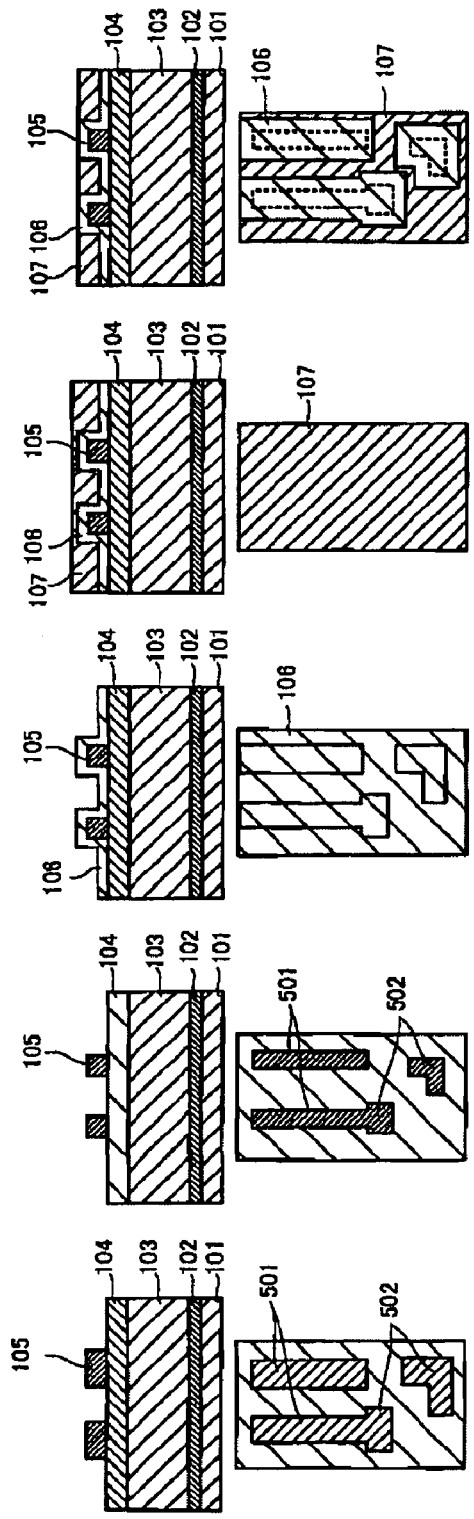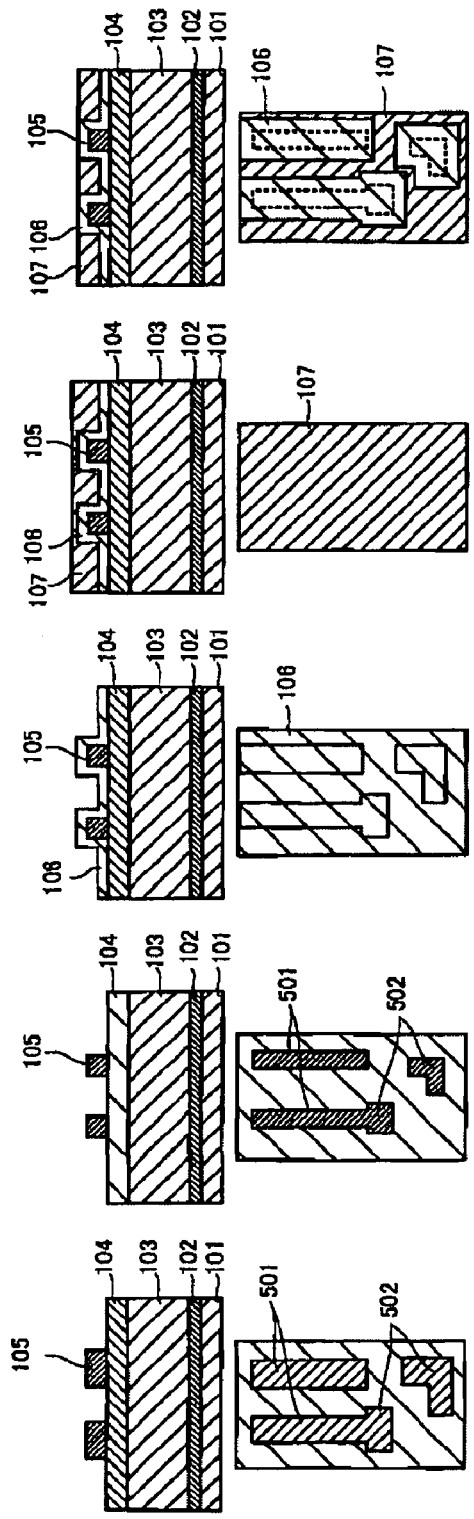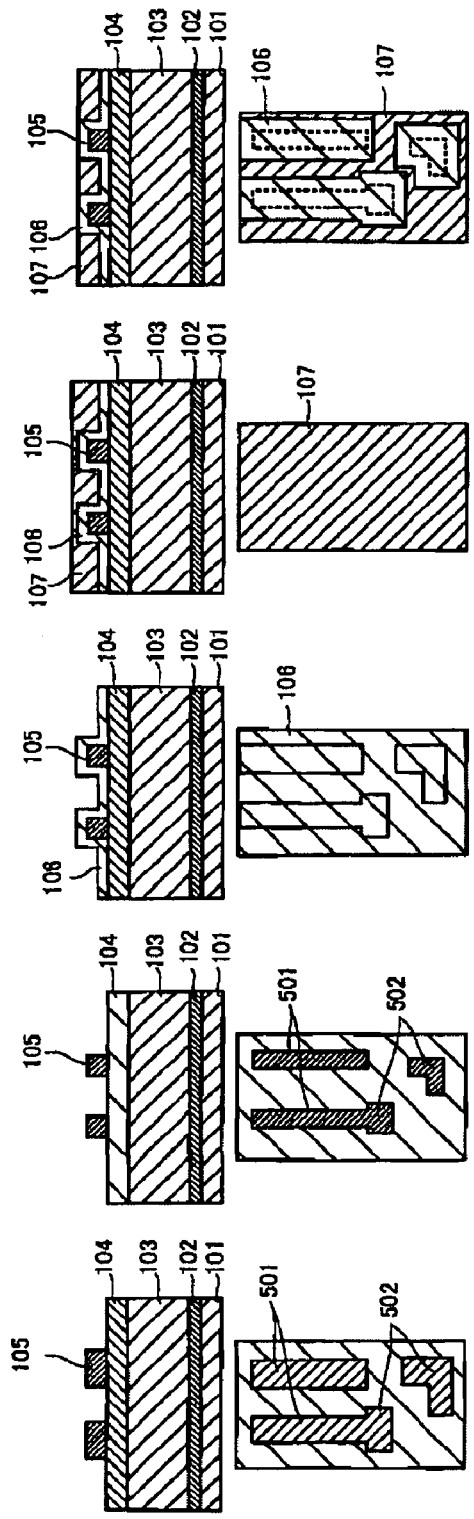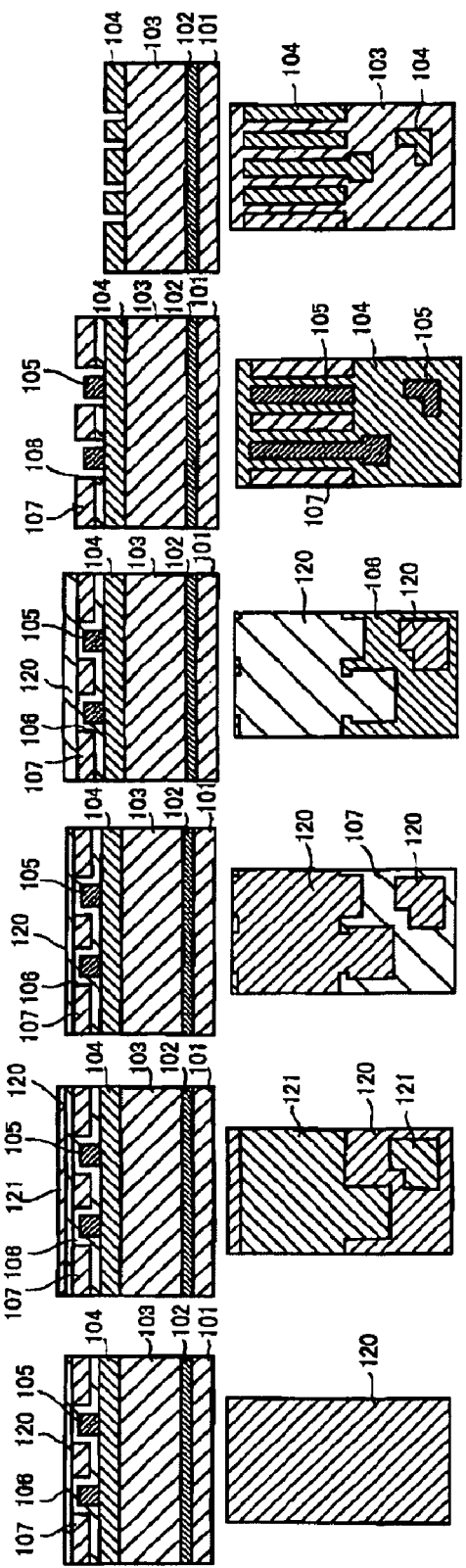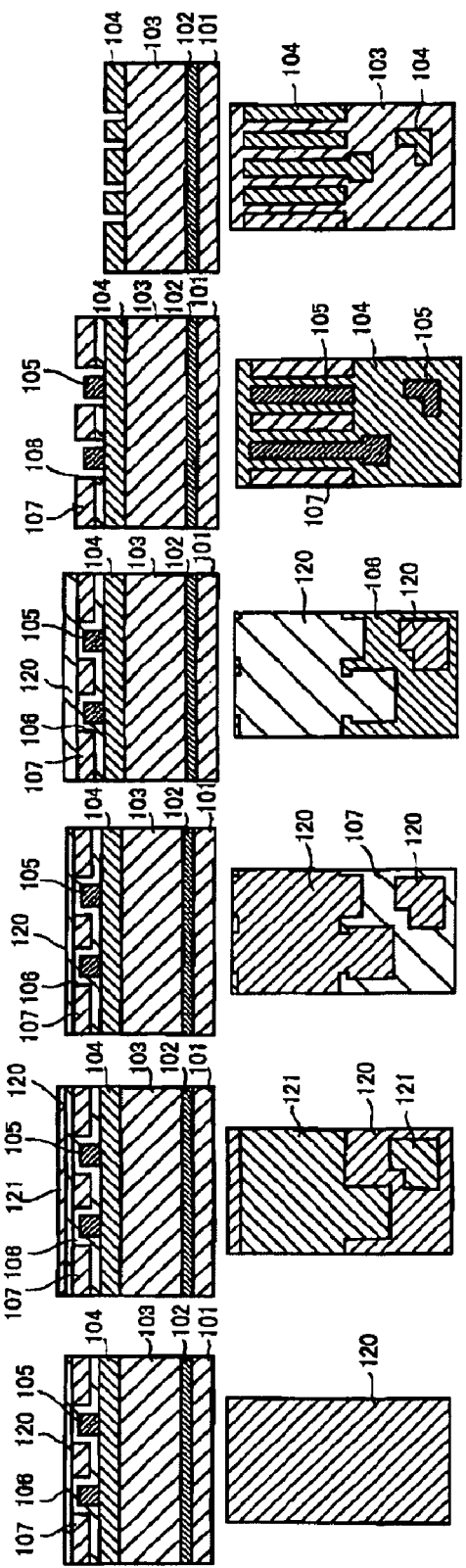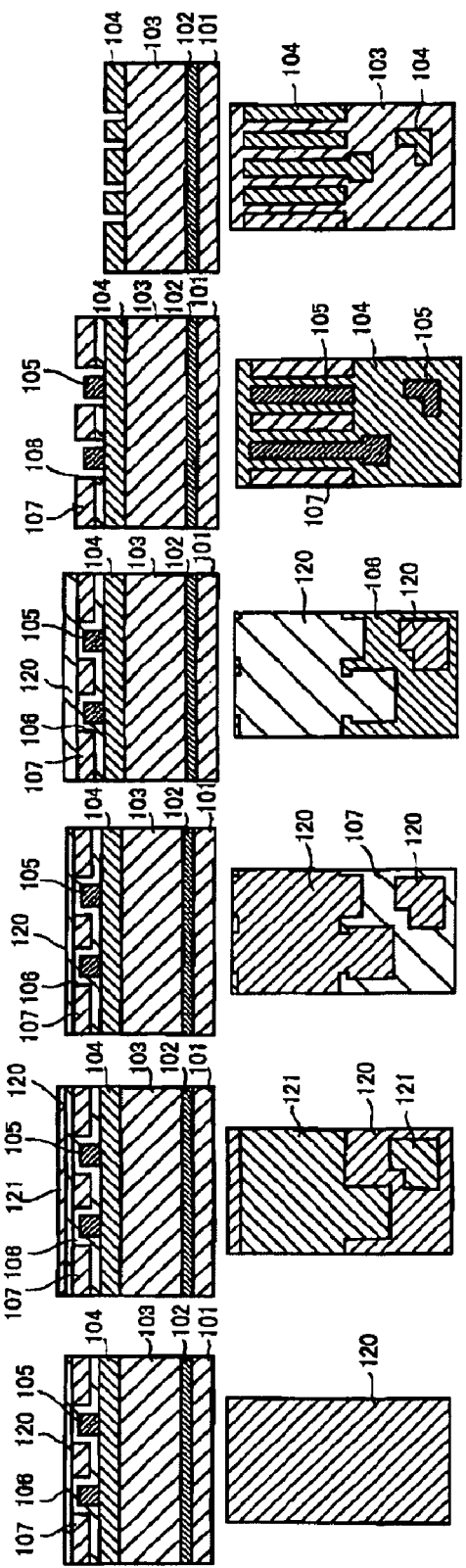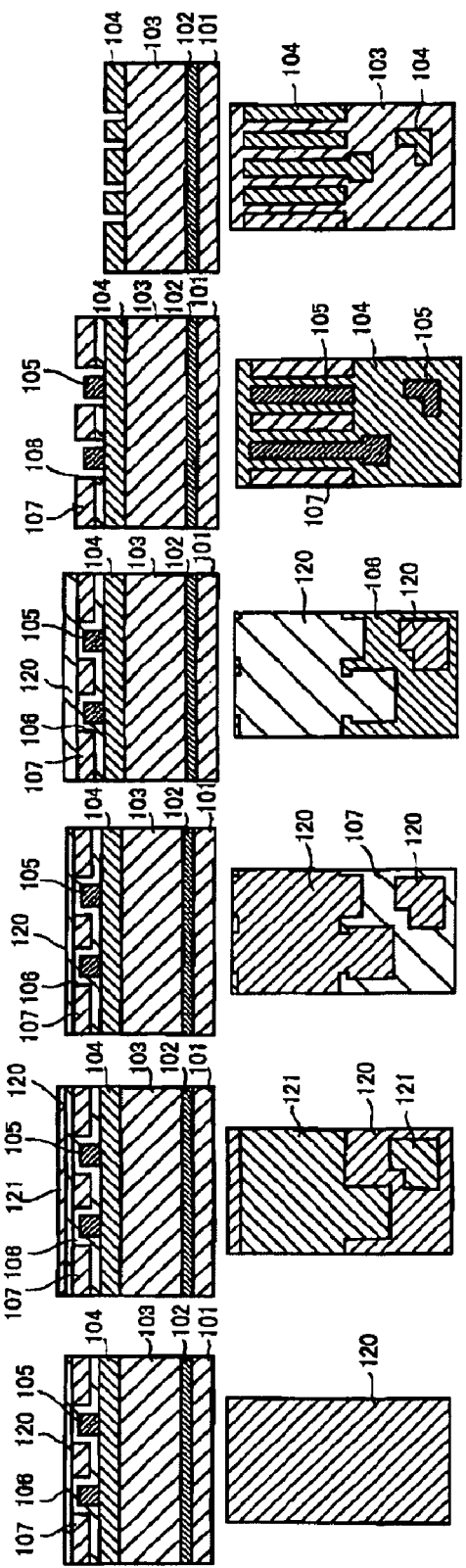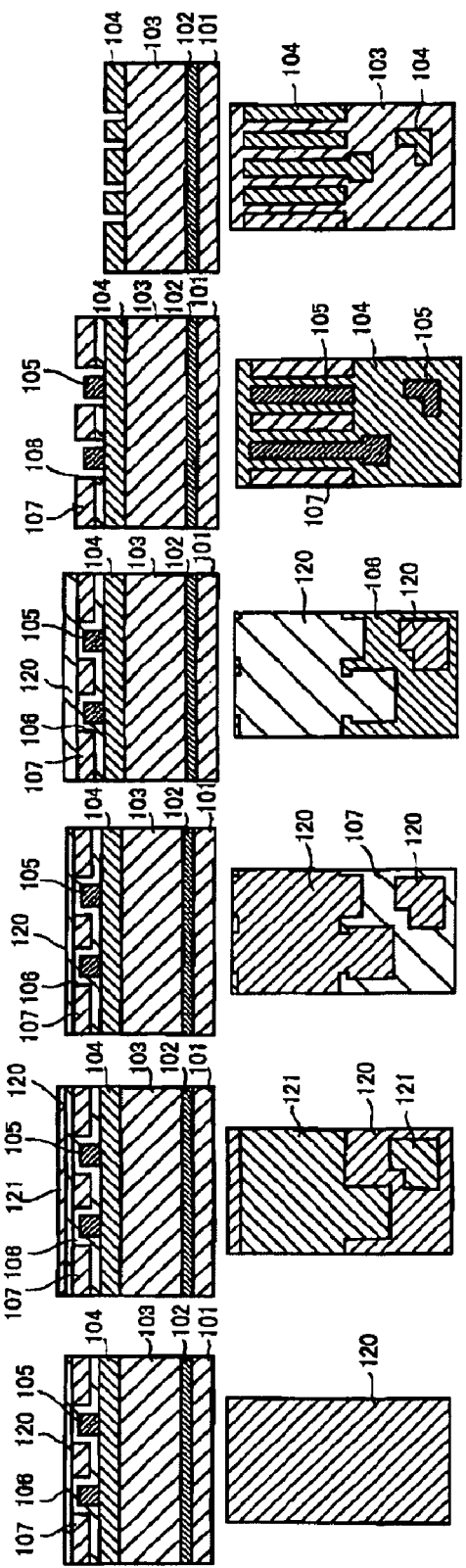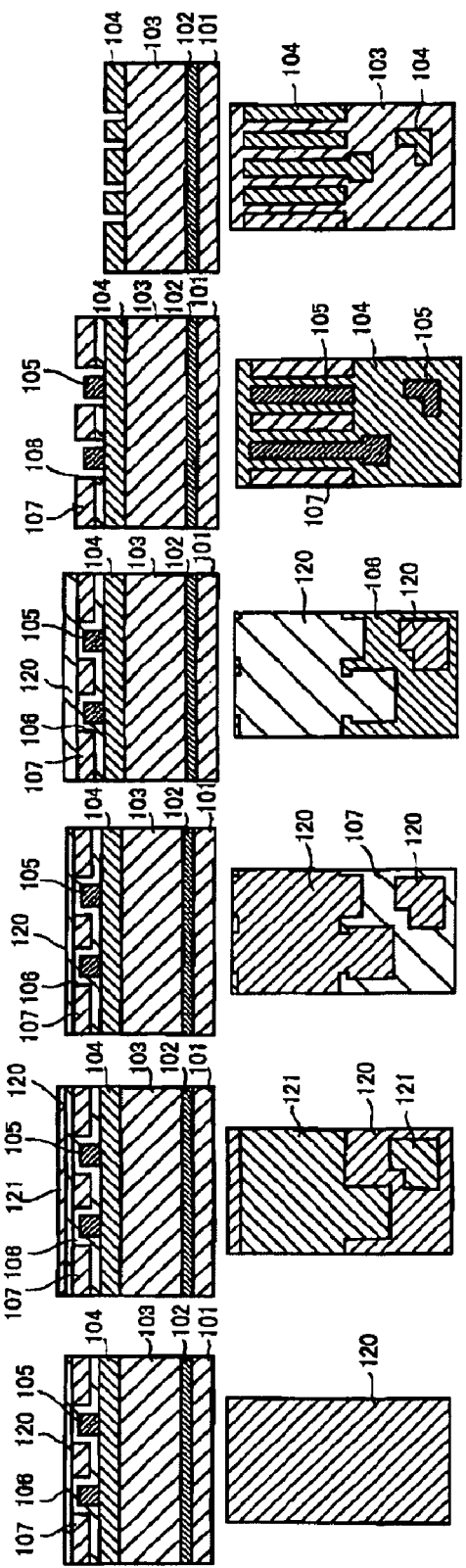

FIG.8A
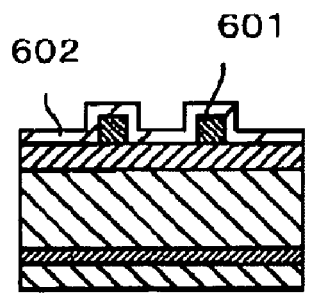
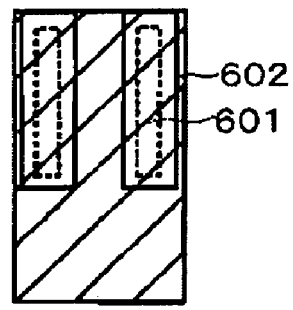
FIG.8B
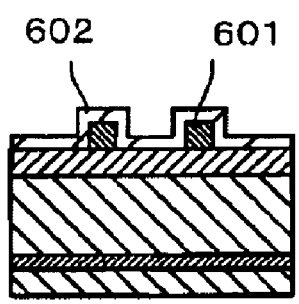
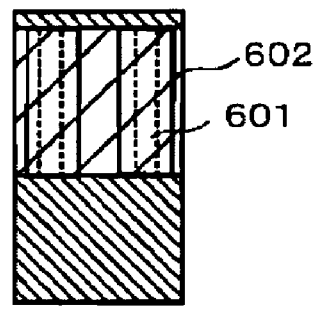
FIG.8C
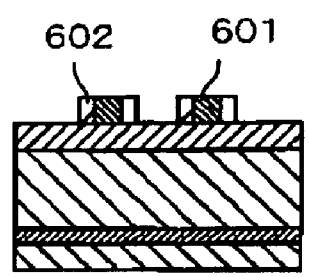
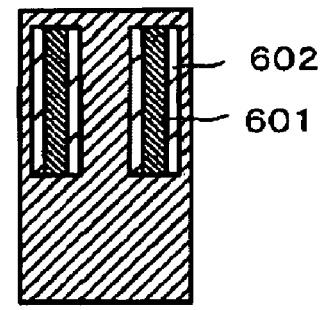

PATTERN FORMING METHOD, SEMICONDUCTOR DEVICE MANUFACTURING METHOD AND SEMICONDUCTOR DEVICE MANUFACTURING APPARATUS

FIELD OF THE INVENTION

The present disclosure relates to a pattern forming method for forming a mask used in performing an etching process such as a plasma etching process or the like on a substrate such as a semiconductor wafer or the like; and also relates to a semiconductor device manufacturing method and a semiconductor device manufacturing apparatus.

BACKGROUND OF THE INVENTION

Conventionally, in a manufacturing process for a semiconductor device or the like, a microscopic circuit pattern has been formed by performing an etching process, e.g., a plasma etching process on a substrate such as a semiconductor wafer. In this etching process, a mask is formed by a photolithography process employing a photoresist.

With respect to this photolithography process, there have been developed various techniques so as to keep up with the miniaturization of a pattern to be formed. One example is so-called a double patterning. In the double patterning, a two-step patterning is performed. In one step, a first pattern is formed by a first lithography process of performing coating, exposure and development processes on a photoresist; and in the other step, a second pattern is formed by a second lithography process of performing coating, exposure and development processes again on a photoresist after the first lithography process. By performing the two-step patterning, it is possible to form a mask having a finer gap in comparison to a mask formed by performing the patterning only once (for example, see Patent Document 1). Further, there has been known a technique using a hard mask made of an inorganic material in which a pattern is formed by a self-alignment without performing exposure processes several times (for example, see Patent Document 2).

Patent Document 1: U.S. Pat. No. 7,064,078
Patent Document 2: U.S. Patent Laid-Open Application No. 2007/0148968

BRIEF SUMMARY OF THE INVENTION

As stated above, in the double patterning technique for forming a mask of the photoresist, exposure processes are performed two times while lithography processes are performed two times. As a result, there have been problems that the process becomes complicated and the manufacturing cost of a semiconductor device increases; and there have been other problems that it is difficult to accurately perform an alignment with respect to a first exposure process in a second exposure process and it is difficult to accurately perform the patterning. Further, in the double patterning technique using the hard mask, there has been a problem that a microscopic pattern which is finer than an exposure limit can not be formed.

In view of the foregoing, the present disclosure provides a pattern forming method capable of accurately forming a microscopic pattern which is finer than the exposure limit without performing the second exposure process, thereby simplifying the process in comparison to the conventional process and reducing the manufacturing cost of the semiconductor device; and also provides a semiconductor device manufacturing method and a semiconductor device manufacturing apparatus.

In accordance with one aspect of the present disclosure, there is provided a pattern forming method for forming a pattern of a predetermined shape which serves as a mask for etching an etching target layer on a substrate, the method including: a first pattern forming process for forming a first pattern by patterning a first mask material layer made of a photoresist; a trimming process for reducing a width of the first pattern to a predetermined width; a boundary layer forming process for forming a boundary layer, which is made of a material selectively removable with respect to the photoresist, on a surface of the first pattern; a second mask material layer forming process for forming a second mask material layer, which is made of a material that allows the boundary layer to be selectively removed, on a surface of the boundary layer; a second mask material removing process for removing a part of the second mask material layer to expose top portions of the boundary layer; and a boundary layer etching process for exposing the first pattern and forming a second pattern having the second mask material layer at a top portion thereof by etching the boundary layer.

In accordance with another aspect of the present disclosure, there is provided a semiconductor device manufacturing method including: a process for etching an etching target layer on a substrate through a mask, wherein the mask is formed by a pattern forming method including: a first pattern forming process for forming a first pattern by patterning a first mask material layer made of a photoresist; a trimming process for reducing a width of the first pattern to a predetermined width; a boundary layer forming process for forming a boundary layer, which is made of a material selectively removable with respect to the photoresist, on a surface of the first pattern; a second mask material layer forming process for forming a second mask material layer, which is made of a material that allows the boundary layer to be selectively removed, on a surface of the boundary layer; a second mask material removing process for removing a part of the second mask material layer to expose top portions of the boundary layer; and a boundary layer etching process for exposing the first pattern and forming a second pattern having the second mask material layer at a top portion thereof by etching the boundary layer.

In accordance with still another aspect of the present disclosure, there is provided a semiconductor device manufacturing apparatus for forming a mask for etching an etching target layer on a substrate, the apparatus including: a first pattern forming unit for forming a first pattern by patterning a first mask material layer made of a photoresist; a trimming unit for reducing a width of the first pattern to a predetermined width; a boundary layer forming unit for forming a boundary layer, which is made of a material selectively removable with respect to the photoresist, on a surface of the first pattern; a second mask material layer forming unit for forming a second mask material layer, which is made of a material that allows the boundary layer to be selectively removed, on a surface of the boundary layer; a second mask material removing unit for removing a part of the second mask material layer to expose top portions of the boundary layer; and a boundary layer etching unit for exposing the first pattern and forming a second pattern having the second mask material layer at a top portion thereof by etching the boundary layer.

BRIEF DESCRIPTION OF THE DRAWINGS

The disclosure may best be understood by reference to the following description taken in conjunction with the following figures:

FIG. 2 is a flowchart showing a process of the method of FIGS. 1A to 1G;

FIGS. 7A to 7K are views for explaining a pattern forming method and a semiconductor device manufacturing method in accordance with the another embodiment of the present disclosure;

FIGS. 8A to 8C are views for explaining a pattern forming process by a sidewall transfer process.

EXPLANATION OF CODES

Figure 1A:
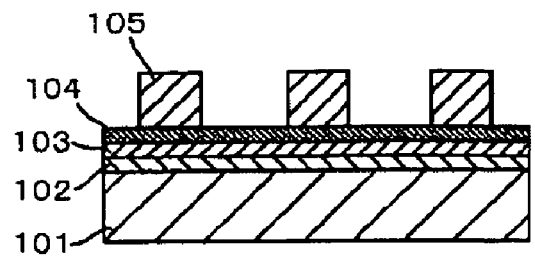
FIGS. 1A to 1G are views for explaining a pattern forming method and a semiconductor device manufacturing method in accordance with an embodiment of the present disclosure.

101: substrate
102: first layer
103: second layer
104: third layer
105: first pattern
106: boundary layer
107: second mask material layer

DETAILED DESCRIPTION OF THE INVENTION

Hereinafter, embodiments of the present disclosure will be described in detail with reference to the accompanying drawings.

FIGS. 1A to 1G show enlarged schematic views of a part of a substrate in accordance with an embodiment of the present disclosure so as to illustrate a process of the present embodiment, and FIG. 2 is a flowchart showing the process of the present embodiment. As illustrated in FIGS. 1A to 1G, formed on a substrate 101 is a multilayer of a first layer 102, a second layer 103 and a third layer 104 which are made of different materials. Among these layers, at least one layer (the third layer 104) becomes an etching target layer.

First, as illustrated in FIG. 1A, performed is a first pattern forming process for forming a first pattern 105, which is made of a photoresist patterned in a predetermined pattern, by performing coating, exposure and development processes on the third layer 104 (Step 201 of FIG. 2). As the photoresist (first mask material) for forming the first pattern 105, it is desirable to use an ArF resist so as to form a finer pattern, and a positive type chemically amplified resist may be used, for example.

Figure 1E:
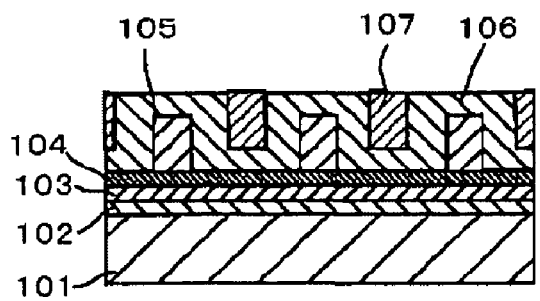
Figure 1B:
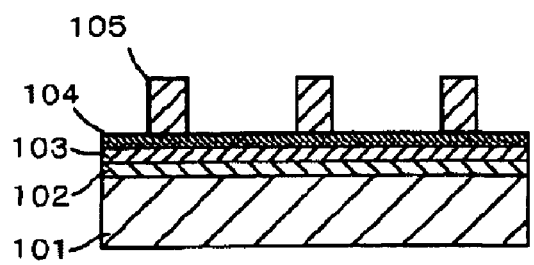

Thereafter, as illustrated in FIG. 1B, performed is a trimming process for reducing a width of the first pattern 105 to a predetermined width (Step 202 of FIG. 2). The trimming process can be performed by, for example, an immersion method in a developing solution having a high temperature or a high concentration for a long period of time; a developing method after a coating process with an acid material or an exposing process to an acid vapor atmosphere; a method of performing a pre-processing of an immersion process in a developing solution having a high temperature or a high concentration for a long period of time and then performing a developing process after a coating process with an acid material or an exposing process to an acid vapor atmosphere; or a method of performing a coating process with an acid material or an exposing process to an acid vapor atmosphere and then performing a developing process after coating a top portion of a pattern with an amine-based material neutralizing the acid or exposing it to a vapor atmosphere.

Figure 1F:
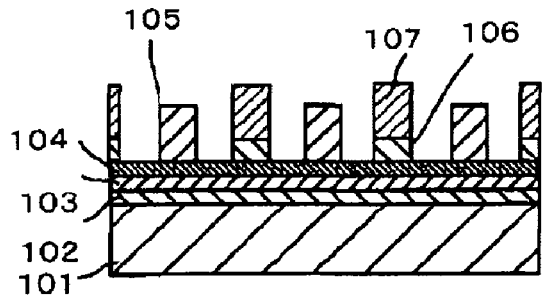
Figure 1C:
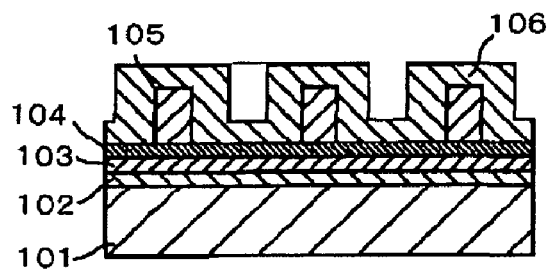

Subsequently, as illustrated in FIG. 1C, performed is a boundary layer forming process for forming a boundary layer 106 of a predetermined thickness on a surface of the first pattern 105 and an exposed surface of the third layer 104 (Step 203 of FIG. 2). The boundary layer 106 needs to be made of a material which can be selectively removed with respect to the photoresist constituting the first pattern 105. As a material of the boundary layer 106, an inorganic material such as $SiO_2$ can be appropriately used. In case of forming the boundary layer 106 by using $SiO_2$, it is necessary to perform the film forming process at a temperature lower than a heat resistant temperature of the first pattern 105. The boundary layer 106 is formed in a uniform thickness at the top portions and the sidewall portions of the first pattern 105 according to a shape of the first pattern 105, and thus it is necessary to form a surface shape of the boundary layer 106 to conform to the shape of the first pattern 105. Therefore, it is formed with an accuracy of an atomic layer level by using, for example, a low temperature CVD, in particular, a MLD (Molecular Layer Deposition) or an ALD (Atomic Layer Deposition). Further, since a width of a second pattern to be described later is determined according to a thickness of the boundary layer 106, the thickness of the boundary layer 106 is set to be the same as the width of the first pattern 105 which has been reduced in the trimming process, for example.

Figure 1G:
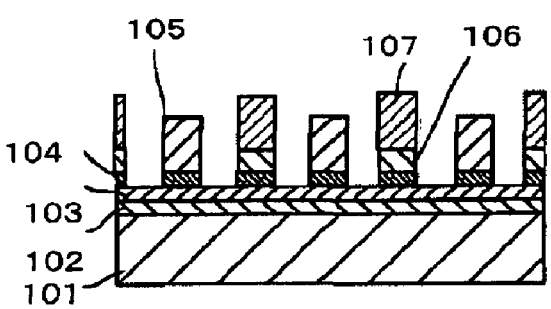
Figure 1D:
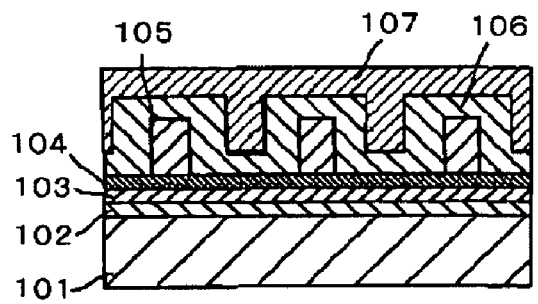

Thereafter, as illustrated in FIG. 1D, performed is a second mask material layer forming process for forming a second mask material layer 107 so as to cover surfaces of the boundary layer 106 (Step 204 of FIG. 2). The second mask material layer 107 needs to be made of a material which allows the boundary layer 106 to be selectively removed, and a photoresist or an organic film can be used, for example. In case of using the photoresist, it may be possible to use the same photoresist as the photoresist constituting the first pattern 105 or use a different kind of photoresist (e.g., a KrF resist if the first pattern 105 is made of an ArF resist). In this case, the second mask material layer 107 can be formed through a coating process by a spin coating apparatus or through a film forming process by a CVD apparatus.

Further, as illustrated in FIG. 1E, performed is a second mask material removing process for removing a part (surface layer) of the second mask material layer 107 to expose top portions of the boundary layer 106 (Step 205 of FIG. 2). In this second mask material removing process, there may be used a removing method by melting with liquid chemical, a removing method by a dry etching or a chemical and physical removing method by a CMP.

Subsequently, as illustrated in FIG. 1F, performed is a boundary layer etching process for exposing the first pattern 105 and forming a second pattern having the second mask material layer 107 at a top portion thereof, by selectively etching and removing the boundary layer 106 with respect to the first pattern 105 and the second mask material layer 107 (Step 206 of FIG. 2). In this case, since the boundary layer 106 is made of the inorganic material such as $SiO_2$ or the like, it is easy to selectively etch the boundary layer 106 with respect to the first pattern 105 made of the photoresist and the second mask material layer 107 made of the photoresist or the organic film. The boundary layer etching process can be performed by, e.g., a dry etching or a wet etching using dilute hydrofluoric acid.

Through performing the above-stated process, a pattern serving as an etching mask is formed. Further, by using this pattern as a mask, performed is an etching process on the third layer 104 as a lower layer or the like, as illustrated in FIG. 1G.

As stated above, in the pattern forming method in accordance with the present embodiment, performed is only the first exposure process for forming the first pattern 105 without requiring a second exposure process. Therefore, there is no need for an alignment to be performed in the second exposure process and there occurs no misalignment during the alignment. Accordingly, it is possible to accurately form a pattern and to simplify the process in comparison to the conventional process, thereby reducing a manufacturing cost of a semiconductor device. Further, by trimming the first pattern 105, it is possible to form a microscopic pattern which is finer than an exposure limit of an exposure device.

Figure 3:
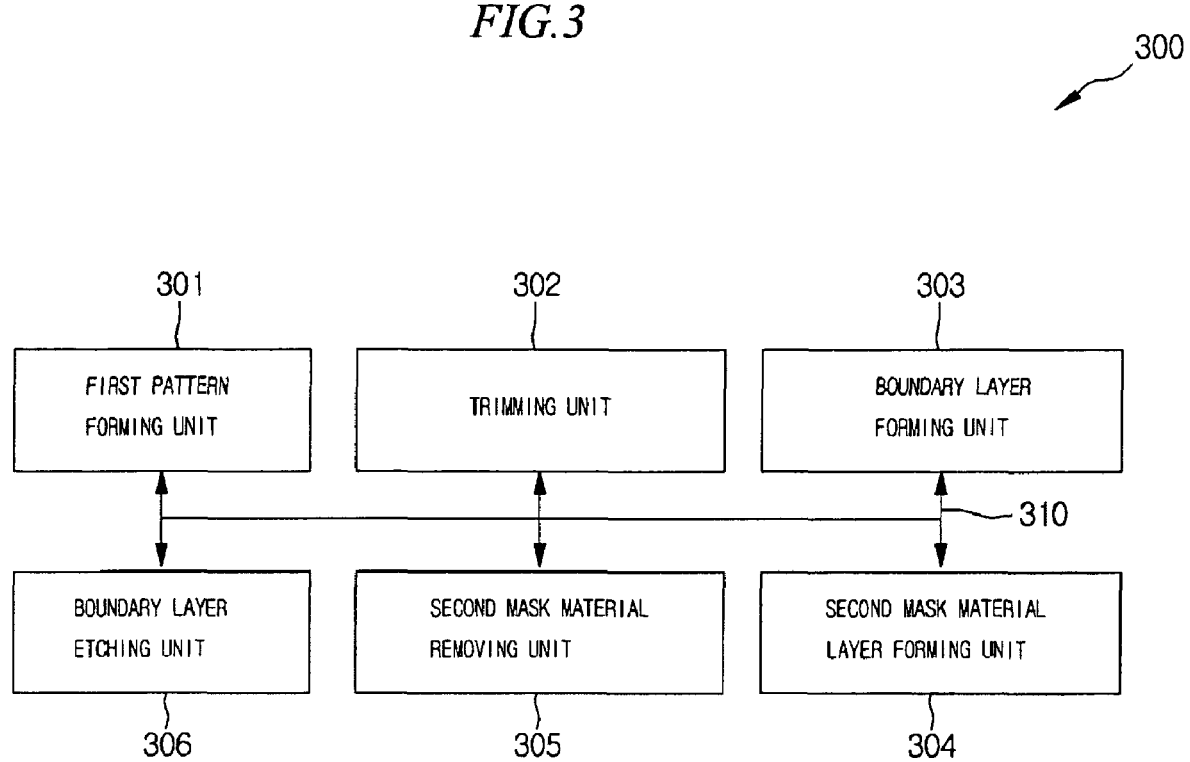
FIG. 3 is a block diagram showing a configuration of a semiconductor device manufacturing apparatus in accordance with an embodiment of the present disclosure.

FIG. 3 shows a configuration of a semiconductor device manufacturing apparatus for performing the above-stated pattern forming method. As illustrated in FIG. 3, a semiconductor device manufacturing apparatus 300 includes a first pattern forming unit 301, a trimming unit 302, a boundary layer forming unit 303, a second mask material layer forming unit 304, a second mask material removing unit 305, and a boundary layer etching unit 306. Further, each of these units is connected to each other by a substrate transfer path 310 for transferring a substrate such as a semiconductor wafer or the like.

The first pattern forming unit 301 is used for forming the first pattern 105, and includes a coating device, an exposure device, a developing device and the like. The trimming unit 302 is used for performing the trimming process, and includes an apparatus for immersing a semiconductor wafer into liquid chemical such as a developing solution or for exposing the semiconductor wafer to a vapor atmosphere. The boundary layer forming unit 303 is used for forming the boundary layer 106, and includes a film forming apparatus such as a CVD apparatus. The second mask material layer forming unit 304 is used for forming the second mask material layer 107, and includes a coating device for coating a photoresist or a film forming apparatus for forming an organic film. The second mask material removing unit 305 is used for performing the second mask material removing process which removes a part of the second mask material layer 107 to expose the top portion of the boundary layer 106, and includes a wet or dry etching apparatus, or a CMP apparatus. The boundary layer etching unit 306 is used for performing the boundary layer etching process in which the boundary layer 106 is selectively etched and removed with respect to the first pattern 105 and the second mask material layer 107, and includes a wet or dry etching apparatus. With the semiconductor device manufacturing apparatus 300 configured as stated above, it is possible to perform a series of the processes in the above-stated embodiment.

Hereinafter, another embodiment will be described with reference to FIGS. 4A to 4I and FIG. 5. FIGS. 4A to 4I are enlarged schematic views of a part of a substrate in accordance with the present embodiment so as to illustrate a process of the present embodiment, and FIG. 5 is a flowchart showing the process of the present embodiment. In FIGS. 4A to 4I and FIG. 5, the components corresponding to those of FIGS. 1A to 1G and FIG. 2 are assigned with the same reference numerals.

Figure 4A:
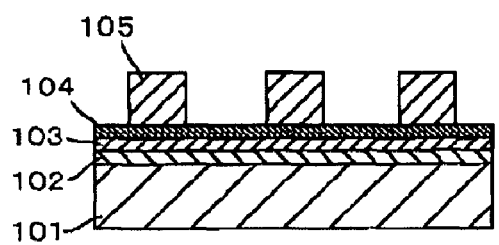
FIGS. 4A to 4I are views for explaining a pattern forming method and a semiconductor device manufacturing method in accordance with another embodiment of the present disclosure.
Figure 4B:
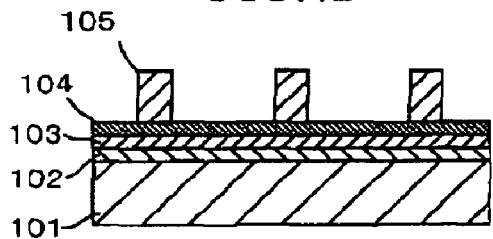
Figure 4C:
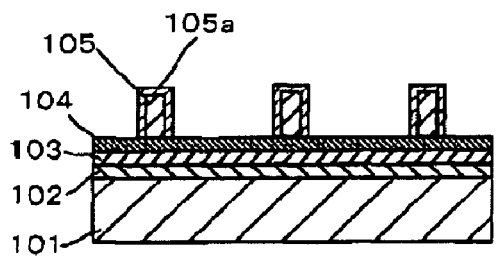
Figure 4D:
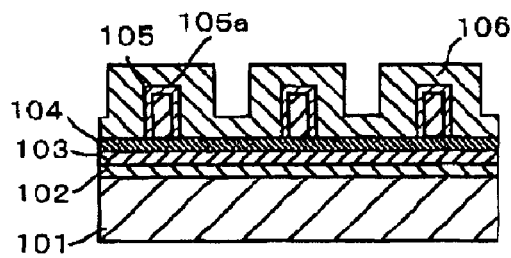
Figure 4E:
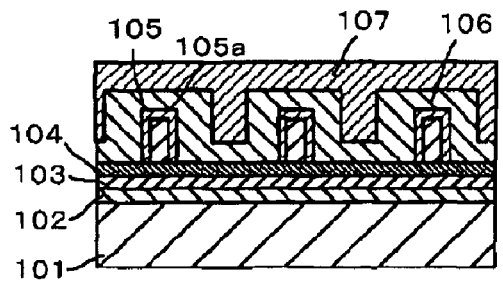
Figure 4F:
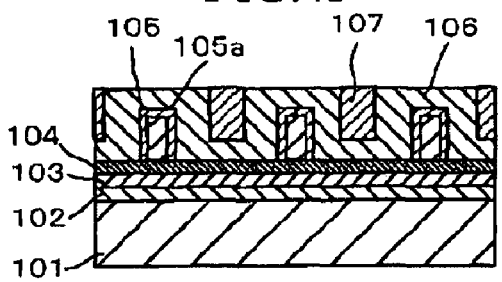
Figure 4G:
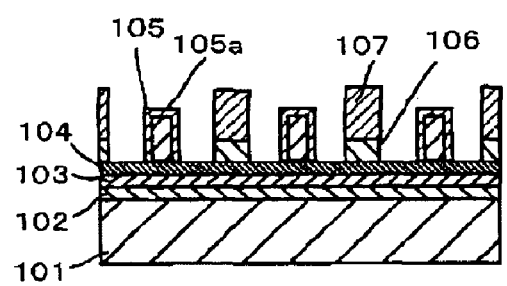
Figure 4H:
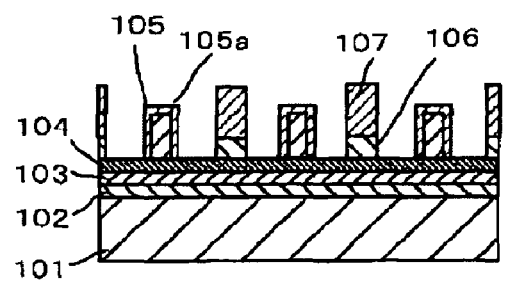
Figure 4I:
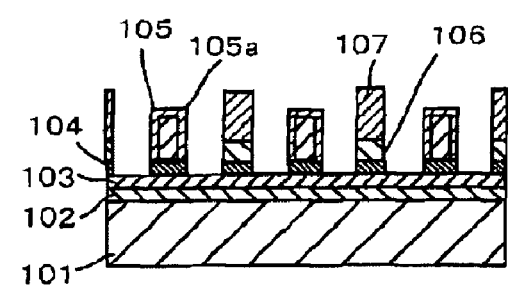
Figure 5:
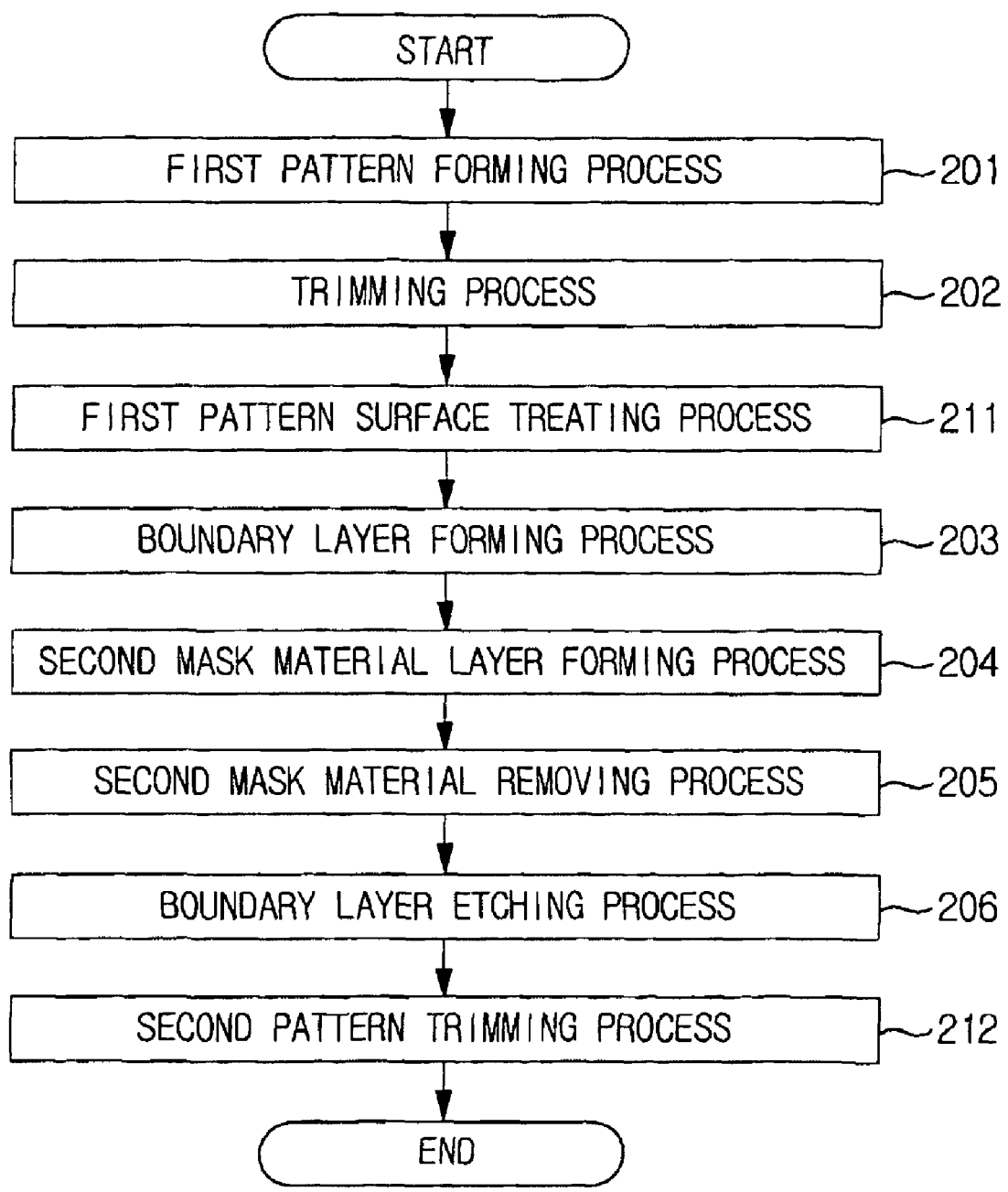
FIG. 5 is a flowchart showing a process of the method of FIGS. 4A to 4I.

In the present embodiment, between the trimming process (FIG. 4B and Step 202 of FIG. 5) and the boundary layer forming process (FIG. 4D and Step 203 of FIG. 5) illustrated in FIGS. 4A to 4I and FIG. 5, provided is a first pattern surface treating process for modifying or hardening a surface 105a of the first pattern 105 (FIG. 4C and Step 211 of FIG. 5). In addition, also provided after the boundary layer etching process (FIG. 4G and Step 206 of FIG. 5) is a second pattern trimming process for reducing a width of the second pattern to a predetermined width (FIG. 4H and Step 212 of FIG. 5). The processes other than these two processes are performed in the same manner as in the embodiment illustrated in FIGS. 1A to 1G and FIG. 2.

In the first pattern surface treating process (FIG. 4C and Step 211 of FIG. 5), the surface 105a of the first pattern 105 is modified or hardened by performing, for example, a silylation process or the like, thereby allowing the first pattern 105 to have a resistance against the developing solution or the liquid chemical such as thinner or hydrofluoric acid which is used in the following process. Further, the surface treating process is not limited to the silylation process, and other process can be used as long as it allows the first pattern 105 to have the resistance against the developing solution or the liquid chemical such as thinner or hydrofluoric acid which is used in the following process. Further, it is desirable that at least the surface 105a of the first pattern 105 is modified or hardened, and it is also desirable that the inside of the first pattern 105 is modified or hardened.

Moreover, in the second pattern trimming process (FIG. 4H and Step 212 of FIG. 5), the second pattern is trimmed by using the same method as the trimming process (FIG. 4B and Step 202 of FIG. 5) or by using a different trimming method. Here, since the surface 105a of the first pattern 105 has been modified or hardened, it is possible to independently trim only the second pattern.

In the present embodiment, the first pattern surface treating process and the second pattern trimming process are added so that, in particular, it is possible to accurately control a width (CD) of the second pattern to have a desired width. That is, in the aforementioned embodiment, the width of the second pattern was determined according to the thickness of the boundary layer 106, but in the present embodiment, since only the second pattern is independently trimmed, the width can be accurately controlled to have a desired width.

Figure 6:
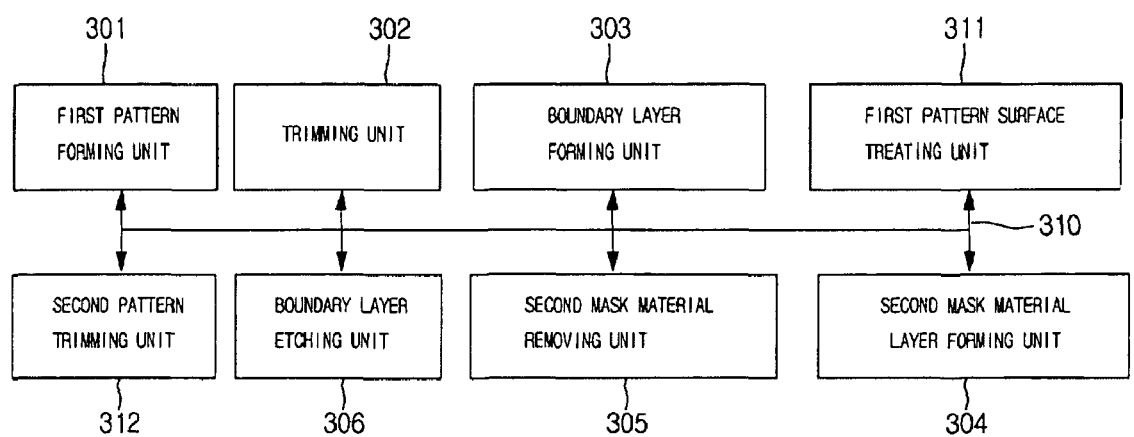
FIG. 6 is a diagram showing a configuration of a semiconductor device manufacturing apparatus in accordance with another embodiment of the present disclosure.

FIG. 6 illustrates a configuration of a semiconductor device manufacturing apparatus for performing the pattern forming method in accordance with the present embodiment. In FIG. 6, the components corresponding to those of FIG. 3 are assigned with the same reference numerals. As illustrated in FIG. 6, a semiconductor device manufacturing apparatus 300a includes, like the semiconductor device manufacturing apparatus 300 described above, a first pattern forming unit 301, a trimming unit 302, a boundary layer forming unit 303, a second mask material layer forming unit 304, a second mask material removing unit 305, a boundary layer etching unit 306 and a substrate transfer path 310. Further, the semiconductor device manufacturing apparatus 300a additionally includes a first pattern surface treating unit 311 and a second pattern trimming unit 312.

The first pattern surface treating unit 311 allows the surface 105a of the first pattern 105 to have the resistance against the developing solution or the liquid chemical such as thinner or hydrofluoric acid which is used in the following process, by modifying or hardening the surface 105a of the first pattern 105 through, for example, a silylation process or the like. In case of performing the silylation process by the first pattern surface treating unit 311, the first pattern surface treating unit 311 includes an apparatus for supplying a silylation gas such as DMSDMA (dimethylsilyldimethylamine), DMSDEA (dimethylsilyldiethylamine), TMSDMA (trimethylsilyldimethylamine) or TMSDEA (trimethylsilyldiethylamine) to a semiconductor wafer or the like. Further, the second pattern trimming unit 312 is used for performing the second pattern trimming process described above, and includes an apparatus for immersing the semiconductor wafer or the like into liquid chemical such as a developing solution or for exposing the semiconductor wafer or the like to a vapor atmosphere.

A repeated pattern of a narrow pitch formed by the above-stated process can be used in a semiconductor device such as a NAND-type flash memory. As a method for forming the repeated pattern of a narrow pitch, there has been conventionally known a method employing, for example, a so-called sidewall transfer process.

In the sidewall transfer process, as illustrated in FIGS. 8A to 8C, a film 602 serving as a mask is formed at sidewalls of a first pattern 601 formed by a lithography process using a photoresist, and by removing the first pattern 601 formed first, two patterns are formed from one pattern, thereby forming a pattern of a narrow pitch.

In this case, as illustrated in FIG. 8A, a pattern formed at the sidewalls of the first pattern 601 is formed in a loop shape throughout the entire periphery of the sidewalls. For this reason, as illustrated in FIG. 8B, performed is a second photolithography process so as to remove an unnecessary part of this loop (end loop). Subsequently, the first pattern 601 is removed from a state illustrated in FIG. 8C, and the pattern at the sidewalls is used as a mask. If a pattern of a peripheral circuit or the like is formed at the periphery of the repeated pattern described above, a third photolithography process is performed to form the pattern of the peripheral circuit or the like.

This is because that in case of forming the pattern of the peripheral circuit partially connected with the repeated pattern, since the repeated pattern is formed at the sidewalls of the first pattern 601 as described above, the pattern of the peripheral circuit connected with the repeated pattern can not be formed during the first photolithography process. Further, since the second photolithography process is performed to remove the end loop, the pattern connected with the repeated pattern can not be formed without performing this process.

Contrary to this, in the aforementioned embodiments, since the part of the first pattern 105 made of the photoresist formed in the first pattern forming process remains as a part of the repeated pattern in the end, it is possible to form a pattern of a peripheral circuit partially connected with the repeated pattern during the photolithography process of the first pattern forming process.

FIGS. 7A to 7K illustrate a process of an embodiment of forming a memory cell unit having a repeated pattern of a narrow pitch such as a NAND-type flash memory and a peripheral circuit electrically connected with this memory cell unit, and schematically illustrate cross-sectional configurations thereof in upper sides and plane configurations thereof in lower sides.

In the present embodiment, as illustrated in FIG. 7A, during a process corresponding to the first pattern forming process illustrated in FIG. 1A, formed are a repeated pattern portion 501 in which a plurality of same patterns is formed at a predetermined distance and a peripheral circuit pattern portion 502 formed at a periphery of the repeated pattern portion 501. A part of the peripheral circuit pattern portion 502 may be connected with the repeated pattern portion 501.

Subsequently, as illustrated in FIGS. 7B to 7E, performed are a trimming process (FIG. 7B); a boundary layer forming process (FIG. 7C) for forming a boundary layer 106 having a predetermined thickness; a second mask material layer forming process (FIG. 7D) for forming a second mask material layer 107 to cover a surface of the boundary layer 106; and a second mask material removing process (FIG. 7E) for removing a part (surface layer) of the second mask material layer 107 to expose top portions of the boundary layer 106, which correspond to the processes illustrated in FIGS. 1B to 1E.

Thereafter, there is performed a second boundary layer forming process (FIG. 7F) for forming a second boundary layer 120 made of a material (e.g., $SiO_2$ or the like), which can be selectively removed with respect to a photoresist, on the second mask material layer 107 and the boundary layer 106.

Then, performed is a third mask material layer forming process (FIG. 7G) for forming a third mask material layer 121, which is made of a photoresist and formed in a predetermined pattern, on the second boundary layer 120. The third mask material layer 121 is formed in a pattern capable of removing unnecessary parts of the second mask material layer 107.

Subsequently, there are performed a process (FIG. 7H) of etching the second boundary layer 120 into a predetermined pattern by using the third mask material layer 121 as a mask, and an etching process (FIG. 7I) of etching the unnecessary parts of the second mask material layer 107 by using the second boundary layer 120 of the predetermined pattern as a mask.

Thereafter, performed is a process (FIG. 7J), which corresponds to the boundary layer etching process as illustrated in FIG. 1F, for etching the boundary layer 106. As a result, a pattern serving as an etching mask is formed. Further, by using this pattern as a mask, performed is a process (FIG. 7K), which corresponds to the etching process as illustrated in FIG. 1G, for etching a third layer 104 and the like as a lower layer.

As stated above, in the present embodiment, by performing the photolithography processes two times, it is possible to form the repeated pattern and the pattern of the peripheral circuit or the like.

The above description of the present invention is provided for the purpose of illustration, and it would be understood by those skilled in the art that various changes and modifications may be made without changing technical conception and essential features of the present invention. Thus, it is clear that the above-described embodiments are illustrative in all aspects and do not limit the present invention.

What is claimed is:

1. A pattern forming method for forming a pattern of a predetermined shape which serves as a mask for etching an etching target layer on a substrate, the method comprising:
   a first pattern forming process for forming a first pattern on the etching target layer by patterning a first mask material layer made of a photoresist;
   a trimming process for reducing a width of the first pattern to a predetermined width;
   a boundary layer forming process for forming a boundary layer, which is made of a material selectively removable with respect to the photoresist, on top portions and sidewall portions of the first pattern and an exposed surface of the etching target layer;
   a second mask material layer forming process for forming a second mask material layer, which is made of a material selectively removable with respect to the boundary layer, on a surface of the boundary layer;
   a second mask material removing process for removing a part of the second mask material layer to expose top portions of the boundary layer;
   a second boundary layer forming process for forming a second boundary layer, which is made of a material selectively removable with respect to the photoresist, on the second mask material layer and the boundary layer;

a third mask material layer forming process for forming a third mask material layer, which is made of a photoresist and formed in a predetermined pattern, on the second boundary layer;

an etching process for etching the second boundary layer into the predetermined pattern by using the third mask material layer as a mask and etching the second mask material layer by using the second boundary layer of the predetermined pattern as a mask; and a boundary layer etching process for exposing the first pattern and forming a second pattern having the second mask material layer on the boundary layer by etching the boundary layer.

2. The pattern forming method of claim 1, wherein, in the boundary layer forming process, the boundary layer is formed to have a thickness same as a predetermined width of the first pattern which is reduced by the trimming process.

3. The pattern forming method of claim 1, wherein the second mask material layer is made of a photoresist.

4. The pattern forming method of claim 1, wherein, in the boundary layer forming process, the boundary layer made of $SiO_2$ is formed by a CVD method.

5. The pattern forming method of claim 1, further comprising:
a first pattern surface treating process for modifying or hardening a surface of the first pattern between the trimming process and the boundary layer forming process; and
a second pattern trimming process for reducing a width of the second pattern to a predetermined width after the boundary layer etching process.

6. The pattern forming method of claim 1, wherein, in the first pattern forming process, formed are a repeated pattern portion in which a plurality of same patterns is formed at a predetermined distance and a peripheral circuit pattern portion formed at a periphery of the repeated pattern portion.

7. A semiconductor device manufacturing method comprising:
a process for etching an etching target layer on a substrate through a mask,
wherein the mask is formed by a pattern forming method including:
a first pattern forming process for forming a first pattern on the etching target layer by patterning a first mask material layer made of a photoresist;
a trimming process for reducing a width of the first pattern to a predetermined width;
a boundary layer forming process for forming a boundary layer, which is made of a material selectively removable with respect to the photoresist, on a surface top portions and sidewall portions of the first pattern and an exposed surface of the etching target layer;
a second mask material layer forming process for forming a second mask material layer, which is made of a material selectively removable with respect to the boundary layer, on a surface of the boundary layer;
a second mask material removing process for removing a part of the second mask material layer to expose top portions of the boundary layer;
a second boundary layer forming process for forming a second boundary layer, which is made of a material selectively removable with respect to the photoresist, on the second mask material layer and the boundary layer;
a third mask material layer forming process for forming a third mask material layer, which is made of a photoresist and formed in a predetermined pattern, on the second boundary layer;
an etching process for etching the second boundary layer into the predetermined pattern by using the third mask material layer as a mask and etching the second mask material layer by using the second boundary layer of the predetermined pattern as a mask; and
a boundary layer etching process for exposing the first pattern and forming a second pattern having the second mask material layer on the boundary layer by etching the boundary layer.

8. The semiconductor device manufacturing method of claim 7, wherein, in the boundary layer forming process, the boundary layer is formed to have a thickness same as a predetermined width of the first pattern which is reduced by the trimming process.

9. The semiconductor device manufacturing method of claim 7, wherein the second mask material layer is made of a photoresist.

10. The semiconductor device manufacturing method of claim 7, wherein, in the boundary layer forming process, the boundary layer made of $SiO_2$ is formed by a CVD method.

11. The semiconductor device manufacturing method of claim 7, further comprising:
a first pattern surface treating process for modifying or hardening a surface of the first pattern between the trimming process and the boundary layer forming process; and
a second pattern trimming process for reducing a width of the second pattern to a predetermined width after the boundary layer etching process.

12. The semiconductor device manufacturing method of claim 7, wherein, in the first pattern forming process, formed are a repeated pattern portion in which a plurality of same patterns is formed at a predetermined distance and a peripheral circuit pattern portion formed at a periphery of the repeated pattern portion.

* * * * *

UNITED STATES PATENT AND TRADEMARK OFFICE
CERTIFICATE OF CORRECTION

PATENT NO. : 8,283,253 B2
APPLICATION NO. : 12/370868
DATED : October 9, 2012
INVENTOR(S) : Hidetami Yaegashi et al.

It is certified that error appears in the above-identified patent and that said Letters Patent is hereby corrected as shown below:

In the claims; column 9 line 53, please delete "a surface".

Signed and Sealed this
Fourteenth Day of May, 2013

Teresa Stanek Rea
*Acting Director of the United States Patent and Trademark Office*